(12) United States Patent  
Soules

(10) Patent No.: US 6,853,999 B1  
(45) Date of Patent: Feb. 8, 2005

(54) METHOD AND APPARATUS FOR DESIGNING LAMPS WITH DIFFERENT PHOSPHOR BLENDS

(75) Inventor: Thomas F. Soules, Richmond Heights, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/245,866

(22) Filed: Sep. 17, 2002

Related U.S. Application Data

(63) Continuation of application No. 09/547,487, filed on Apr. 12, 2000, now abandoned.

(51) Int. Cl.[7] .......................... G06F 17/30; G06F 19/00; H01J 63/04
(52) U.S. Cl. ...................... 707/104.1; 700/97; 700/105; 313/483
(58) Field of Search ...................... 700/95–98, 105–107, 700/116, 117, 265, 266; 313/483–512; 702/22–26; 707/100, 104.1

(56) References Cited

U.S. PATENT DOCUMENTS

| | | | | |
|---|---|---|---|---|
| 4,806,824 A | * | 2/1989 | Paynter et al. ............... 313/486 |
| 5,572,430 A | * | 11/1996 | Akasaka et al. ............... 700/95 |
| 5,619,096 A | * | 4/1997 | Kaliszewski et al. ........ 313/489 |
| 5,675,784 A | * | 10/1997 | Maxwell et al. ............. 707/100 |
| 5,777,876 A | * | 7/1998 | Beauchesne .................. 700/95 |
| 5,963,953 A | * | 10/1999 | Cram et al. .................. 707/102 |
| RE36,602 E | * | 3/2000 | Sebastian et al. ............. 700/97 |
| 6,256,549 B1 | * | 7/2001 | Romero et al. ............. 700/121 |
| 6,377,937 B1 | * | 4/2002 | Paskowitz ..................... 705/26 |
| 6,405,308 B1 | * | 6/2002 | Gupta et al. ................... 713/1 |
| 6,405,344 B1 | * | 6/2002 | Ali et al. ........................ 716/2 |
| 2002/0079479 A1 | | 6/2002 | Cull et al. |

FOREIGN PATENT DOCUMENTS

WO  93-24896  * 12/1993

* cited by examiner

Primary Examiner—Maria N. Von Buhr  
(74) Attorney, Agent, or Firm—Fay, Sharpe, Fagan, Minnich & McKee, LLP

(57) ABSTRACT

An apparatus and method of generating parameters for use in manufacturing lamps employing phosphors includes a series of interconnected spreadsheets. Individual phosphor spectral data are interconnected with lamp operating characteristics and physical construction of the lamp. The phosphor layer, thickness, and precoat are also part of the coating constructions whereby a user can evaluate phosphor blends, design new phosphors, input desired lamp characteristics and obtain desired phosphor spectra and lamp characteristics.

24 Claims, 13 Drawing Sheets

F40 (62)

| | 185nm | 254nm | 303nm | 360nm |
|---|---|---|---|---|
| UV OUTP | 2.3 | 23 | 0 | 0 |
| 6267.5 | 405nm | 435nm | 546nm | 577/579nm |
| VISIBLE | 1 | 1 | 1 | 1 |
| RATIO TO | | | | |

T5 (64)

| | 185nm | 254nm | 303nm | 360nm |
|---|---|---|---|---|
| UV OUTP | 2.3 | 23 | 0 | 0 |
| 6267.5 | 405nm | 435nm | 546nm | 577/579nm |
| VISIBLE | 1 | 1 | 1 | 1 |
| RATIO TO | | | | |

F3218 (66)

| | 185nm | 254nm | 303nm |
|---|---|---|---|
| UV OUTP | 1.93 | 19.32 | 0 |
| 5264.33 | 405nm | 435nm | 546nm |
| VISIBLE | 0.84 | 0.84 | 0.84 |
| RATIO TO | | | |

CFL (68)

| | 185nm | 254nm | 303nm |
|---|---|---|---|
| UV OUTP | 2.3 | 23 | 0 |
| 6267.5 | 405nm | 435nm | 546nm |
| VISIBLE | 1 | 1 | 1 |
| RATIO TO | | | |

LUMENS/POWER FOR FLUORESCENT LAMPS OF DIFFERENT LENGTH (80)

| | OVERALL LAMP LENGTH (INCH) | DISTANCE CATHODE TO LAMP END (INCH) | CATHODE TO CATHODE DISTANCE (CCD) | INTERCEPT OF LIGHT OUTPUT VS CCD (INCH) | EFFECTIVE ARC LENGTH (INCH) | TOTAL LAMP POWER (W) | CATHODE POWER (W) | LAMP CURRENT (A) | INTERCEPT OF LIGHT OUTPUT VS LAMP (VOLTAGE) | INTERCEPT OF LIGHT OUTPUT POWER FACTOR | EFFECTIVE ARC POWER (W) |
|---|---|---|---|---|---|---|---|---|---|---|---|
| REFERENCE LAMP | 47.45 | 1.25 | 44.95 | 0.35 | 44.60 | 32.40 | 1.80 | 0.265 | 15.00 | 0.90 | 27.02 |
| DIFFERENT LENGTH LAMP | 23.45 | 1.25 | 20.95 | 0.35 | 20.60 | 17.86 | 1.80 | 0.265 | 15.00 | 0.90 | 12.48 |

LINEAR F-LAMP DESIGN TOOL (120)

| | OVERALL LAMP LENGTH (INCH) | DISTANCE CATHODE TO LAMP END (INCH) | CATHODE TO CATHODE DISTANCE (CCD) | INTERCEPT OF LIGHT OUTPUT VS CCD (INCH) | EFFECTIVE ARC LENGTH (INCH) | TOTAL LAMP POWER (W) | AUXILIARY OF LIGHT OUTPUT VS LAMP VOLTAGE | LAMP CURRENT (A) | INTERCEPT OF LIGHT OUTPUT VS LAMP VOLTAGE | POWER FACTOR | TUBE OD (1/8th's INCH) |
|---|---|---|---|---|---|---|---|---|---|---|---|
| LAMP TO BE DESIGNED | 47.45 | 1.25 | 44.95 | 0.35 | 44.60 | 32.40 | 1.80 | 0.265 | 15.00 | 0.90 | 27.02 |

| | EFFECTIVE ARC POWER (W) | VOLTS ACROSS LAMP (V) | ARC POWER PER UNIT ARC LENGTH | LAMP LUMENS | LUMENS PER EFFECTIVE ARC WATT | TOTAL LAMP EFFICACY (lm/W) |
|---|---|---|---|---|---|---|
| LAMP TO BE DESIGNED | 32.59 | 142.0 | 0.731 | 3271 | 100.4 | 87.37 |

*Fig. 5*

SPREADSHEET TO CALCULATE THE OPTICAL PROPERTIES OF LAYERED FLUORESCENT LAMP COATING

| | PART SIZE (mi) | DENSITY(g/cm) | AREA/REF | # LAYERS | FRAC NOT COV | % UV TRANS | % UV REF | % UV Ab | % VIS T | % VIS R | % VIS Ab |
|---|---|---|---|---|---|---|---|---|---|---|---|
| TOP COAT | 3.5 | 5 | 0.6666667 | 1.8 | 0.0596166 | | | | | | |
| BASE COAT | 9 | 4 | 0.6666667 | 0 | 1 | | | | | | |
| PRECOAT | 1 | 4 | 0.6666667 | 1.575 | 0.0900825 | | | | | | |
| | | | | 1.6434783 | 0.0795059 | | | | | | |

| GLASS REF | 0.08 | GLASS ABS | 0.013 | GLASS TRAN | | PHOS R&T | 0.3793329 | 0.5993466 |
|---|---|---|---|---|---|---|---|---|
| POROSITY | 0.05 | RE-ENT | | LENGTH (CM) | 190 | | 0.3793329 | 0.5993466 |
| PART D(CM) | 0.0003 | BULB AREA | | RE-ENT AREA | 55.959519 | | 189 | 189 |
| LUMENS | BULB WT(MG/C | RE-ENT WT | OUT UV | IN UV ABS | | | 0.6578947 | |
| 2037 | 3 | 4 | 0 | 0 | | | TiO2 REF | UV ABS(CM-1 |
| # OF LAYERS | 3 | 4 | | 3 | | 1.8 | 0.0596166 | 0.0885686 |
| UV ABS | 0.973884 | 0.9934594 | | | | 4 | 92.43376 | 1800 |
| VIS REF | 0.4089695 | 0.4455877 | 0.4455877 | | | | 1.0342857 | 0.0200182 |
| VIS TRANS | 0.5606203 | 0.5261354 | 0.5261354 | | | | 3.7854953 | 0.979818 |
| VIS ABS | 0.0304102 | 0.0282769 | 0.0282769 | | | | 6.1428571 | 0.0886045 |
| | | | | | | | 0.1944444 | 0.0056058 |
| | DIRECT LIGHT | FLUX OFF OTHER SIDE | FLUX OFF RE-ENT | | | | 0.8615286 | 0.9943942 |
| | | | | | | | 0.5633232 | |
| LIGHT OUT | 859.12593 | 476.71386 | 435.94274 | 1771.7825 FOR EFL | | | 0.0514528 | INS ABS |
| LIGHT OUT | 253.03347 | 50.821609 | 421.92602 | 1881.7294 FOR LINEAR LAMP | | | 0.0514528 | LIN LAMP ABS |
| | 859.12593 | 172.55489 | 124.26747 | | | | 0.0584286 | |
| | AREA | REF | | | | | | |
| FINGER | 0.25 | 0.8 | | 0.0831732 FROM FINGER | | | | |
| LIGHT ABS | | 0.2812157 | | 0.9168268 | 0.0317204 | | | |

METHOD AND APPARATUS FOR DESIGNING LAMPS WITH DIFFERENT PHOSPHOR BLENDS

This application is a continuation of application Ser. No. 09/547,487, filed Apr. 12, 2000, now abandoned.

BACKGROUND OF THE INVENTION

1. Field of the Invention

This application relates to a system, or apparatus, and a method of simulating lamp performance with different phosphor blends and different lamp parameters. The system is used to quickly design new fluorescent lamps with new phosphor blend coatings. One can input desired lamp characteristics and the system automatically optimizes by varying selected parameters, such as amounts of different phosphors, coating weights, lamp current, lamp length, etc., to achieve the desired performances.

2. Discussion of the Art

Use of phosphors in lamps is well known. For example, fluorescent lamps are well known in the art and advantageously employ phosphors to obtain a desired visible light output. Fluorescent lamps may be linear, compact, circular, U-shaped, etc., and are manufactured in a number of different shapes, sizes, color performance, and wattage ratings. Fluorescent lamps are desirable because of their efficient operation, costing significantly less over their lifetime than incandescent lamps and having an extended life rating on the order of 6,000 to 24,000 hours. As is well known in the art, an arc is formed between cathodes at ends of the fluorescent lamp and the arc ionizes a fill gas contained within the lamp. This radiant energy is converted by the phosphor coated on the lamp into visible light. Still other types of lamps employ phosphors such as electrodeless lamps, high pressure mercury lamps, and light emitting diode lamps (LEDs). Again, the phosphor converts the radiant energy into a desired color in the visible light spectrum.

A myriad of phosphors have been developed over the years. Each phosphor has its own unique signature or spectral distribution in association with a lamp. Thus, lamp manufacturers have developed a wealth of information relating to the spectral properties of individual phosphors. For example, a particular type of lamp having desired physical characteristics, i.e., length, diameter, fill gas, pressure, current, etc. will be coated with an individual phosphor, tested, and a spectral distribution (data) recorded. Phosphor powders do not interact as a result of lamp making, but their spectra are cumulative in nature. Hence, the spectrum of a lamp coated with a blend of phosphors will be a linear combination of the spectra of lamps coated with the individual phosphors.

Nevertheless, even with this collected knowledge and information, the design of lamps using different phosphors, or designing different types of lamps using phosphor blends, or designing a lamp to have desired operating characteristics, is a very tedious, expensive, and time consuming process. A need exists in the industry that will allow a lamp designer to simulate the spectra of various phosphor blends, design any phosphor blend, and to interrelate a phosphor blend with lamp operating characteristics and physical construction of the lamp.

BRIEF SUMMARY OF THE INVENTION

A system for generating parameters for use in designing and/or manufacturing lamps employing phosphors includes a data storage having spectral data stored therein associated with individual phosphors. A second data storage has lamp characteristics stored therein. A processor generates lamp parameters based on information in the first and second data storages A method for generating parameters in designing and manufacturing lamps includes selecting desired phosphors for a lamp coating from a list of phosphors whose spectra are stored in the first data storage. Lamp operating and/or physical characteristics are selected from a second data storage or input by the user. Lamp parameters are then calculated for use in designing and manufacturing lamps.

The present invention allows a lamp designer to tie or interconnect the individual phosphors and simulate a blend, and interconnect the blend with lamp operating characteristics and physical construction, and predict lamp performance.

Alternatively, customer desired lamp requirements can be input, e.g., maximum lumens, fixed color or color range, a range of color rendition indices, coating cost, etc. Then, using a computer algorithm for optimization with constraints, a suitable phosphor blend and lamp parameters are calculated for the simulated lamp which will provide the customer with the desired lamp requirements.

Light output and electrical characteristics may be optimized by varying selected lamp characteristics.

A method of designing or generating parameters or manufacturing specifications for lamps is provided.

BRIEF DESCRIPTION OF THE DRAWINGS

FIG. 5 is the second sheet of the workbook and contains information relating to the lamp itself.

FIG. 6 is a third representative screen illustrating various cells for the input/output of coating characteristics.

FIGS. 7–14 are screens illustrating one way an engineer can use the tool to design a fluorescent lamp.

DETAILED DESCRIPTION OF THE INVENTION

Figure 1:
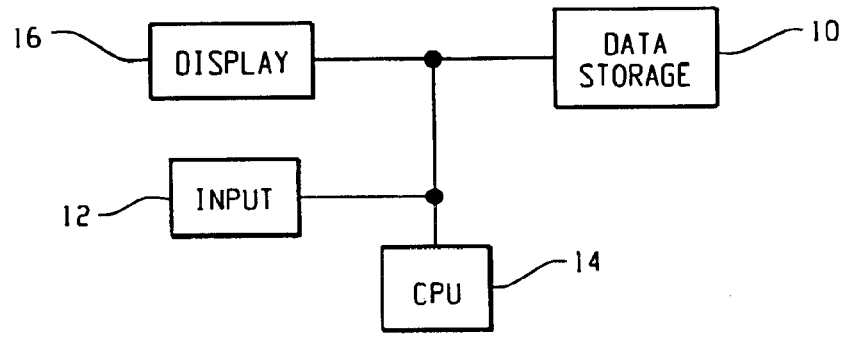
FIG. 1 is a block diagram of a data processing system used in the present invention.

As shown in FIG. 1, a data storage 10 is configured to store data corresponding to lamp characteristics, phosphor and spectral data, instructions/algorithms for manipulating the data, etc. The data storage 10 is interconnected with an input device 12 such as a keyboard, mouse, voice-activated interface, or information interface that allows the user to input information to the data storage. A processor, such as central processing unit or CPU 14, receives, processes, and sends instructions in accordance with the subject invention. A display 16, such as a video terminal, is used to display queries for information input to the system, or results of the operations (e.g., results of spreadsheet calculations), or displays from the data storage. The data storage, input device, CPU, and display are interconnected in a manner well known in the art, including direct connections, through a bus structure, a modem configuration, or other known structures.

Figure 2:
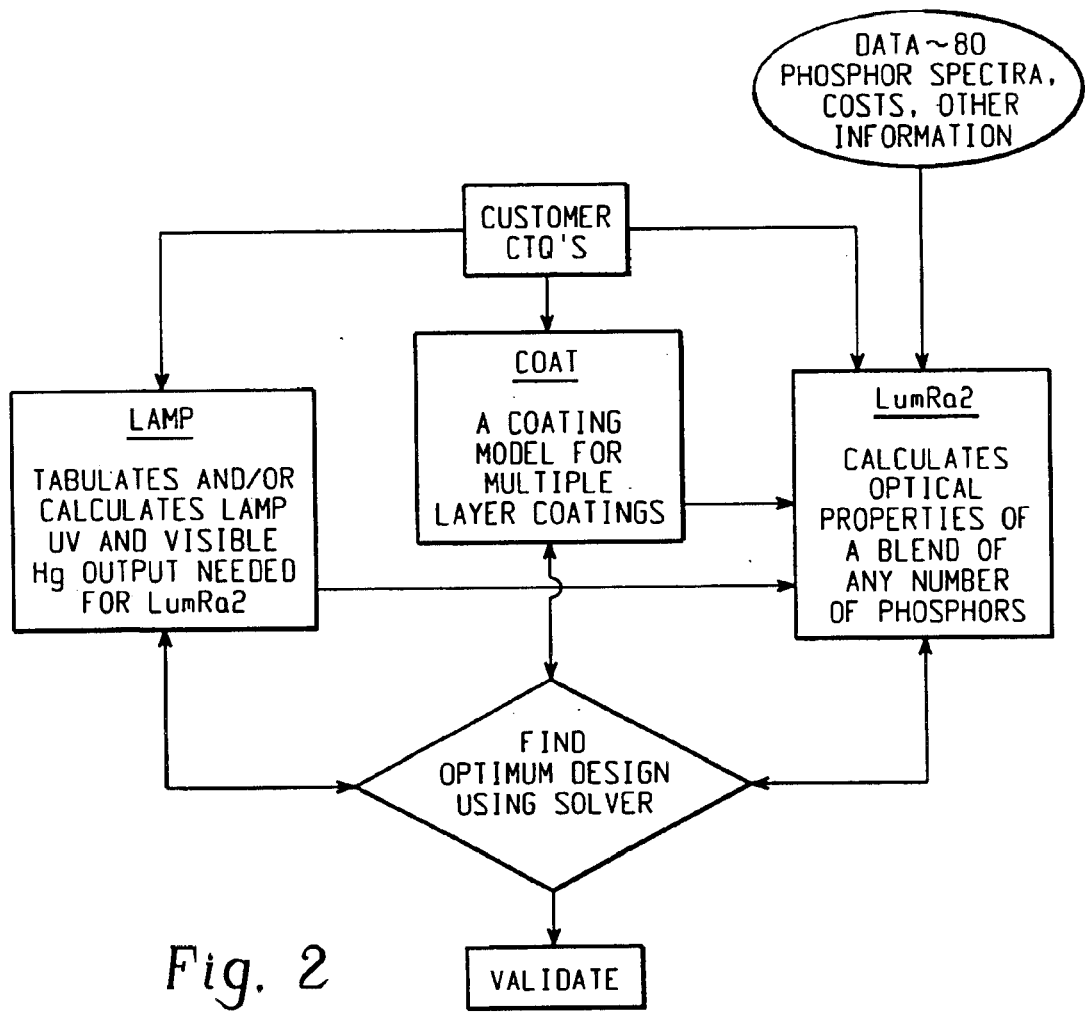
FIG. 2 is a flow chart schematically representing the features and interconnections of the fluorescent lamp design sheets and benefits of the present invention.

FIG. 2 represents a schematic summary of the present invention as a lamp design tool. A user will be able to simulate performance of a lamp with different phosphor blends based on the database of information represented at "DATA" relating to the individual phosphors. By interconnecting the phosphor blends of sheet "LumRa2" with the lamp operating characteristics and physical construction of sheet "LAMP" and the coating sheet "COAT", a wide variety of design features are provided. The invention can be used as a tool to optimize light output or electrical characteristics by varying any of a number of lamp parameters. Blends of different phosphors can be quickly and easily evaluated and new phosphor combinations designed. Alternatively, a customer's desired lamp characteristics can be input as represented as "CUSTOMER CTQ's" and the program permitted to solve or find a phosphor the meets the selected criteria as represented in flow chart step "Final Optimum Design Using SOLVER". By example only, the lumens can be maximized, a fixed color or color range selected, color rendition indices fixed, or a coating cost identified. Once the calculations or iterations are complete, all of the information is displayed as shown in FIG. 3, where the desired phosphor information, lamp characteristics and coating information are obtained.

Figure 3:
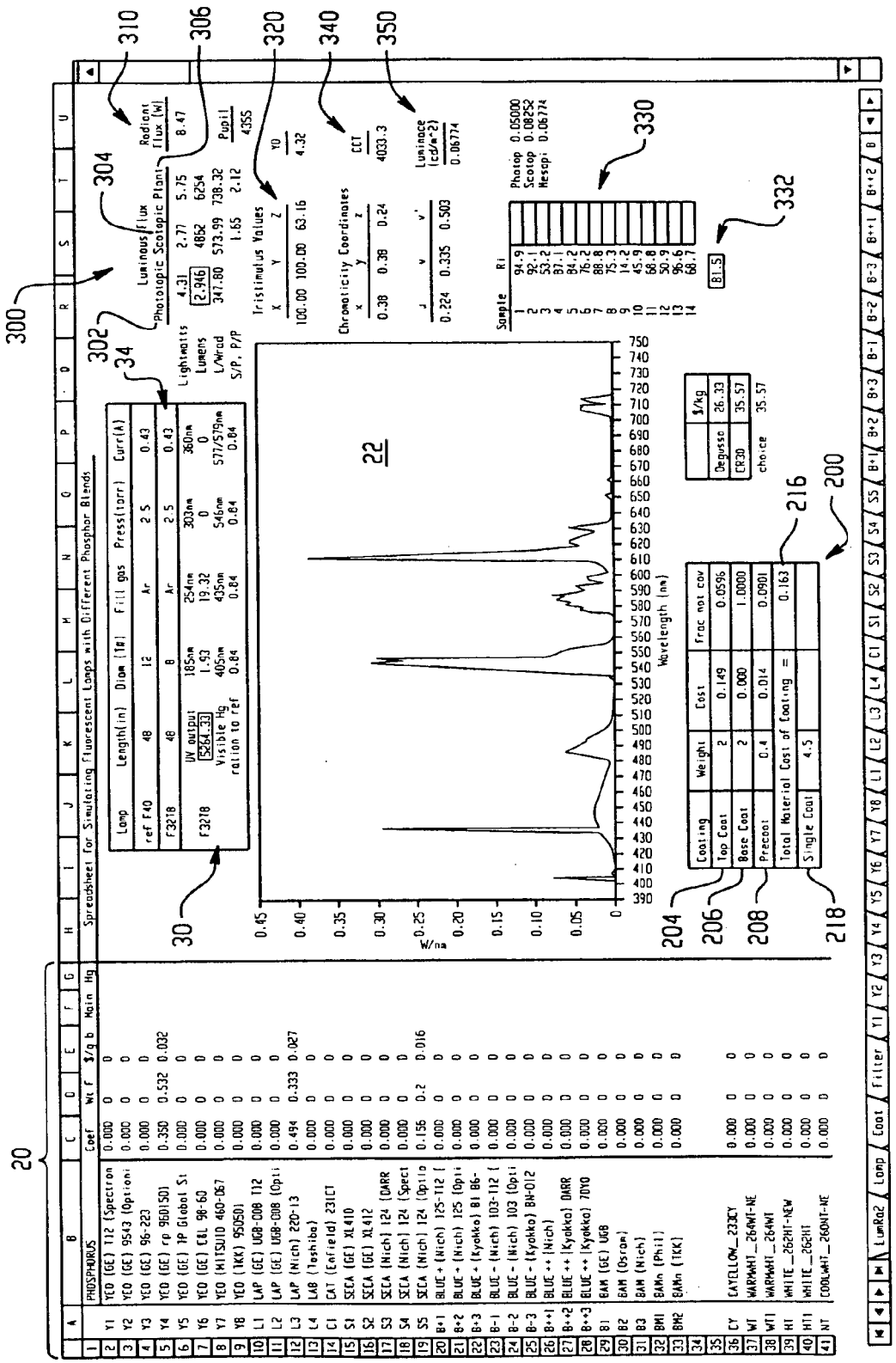
FIG. 3 is a first screen used to calculate the spectra and light output characteristics of the lamp being designed, or it can be used to input information such and then spectrum and light output characteristics will be automatically and immediately recalculated.
Figure 4:
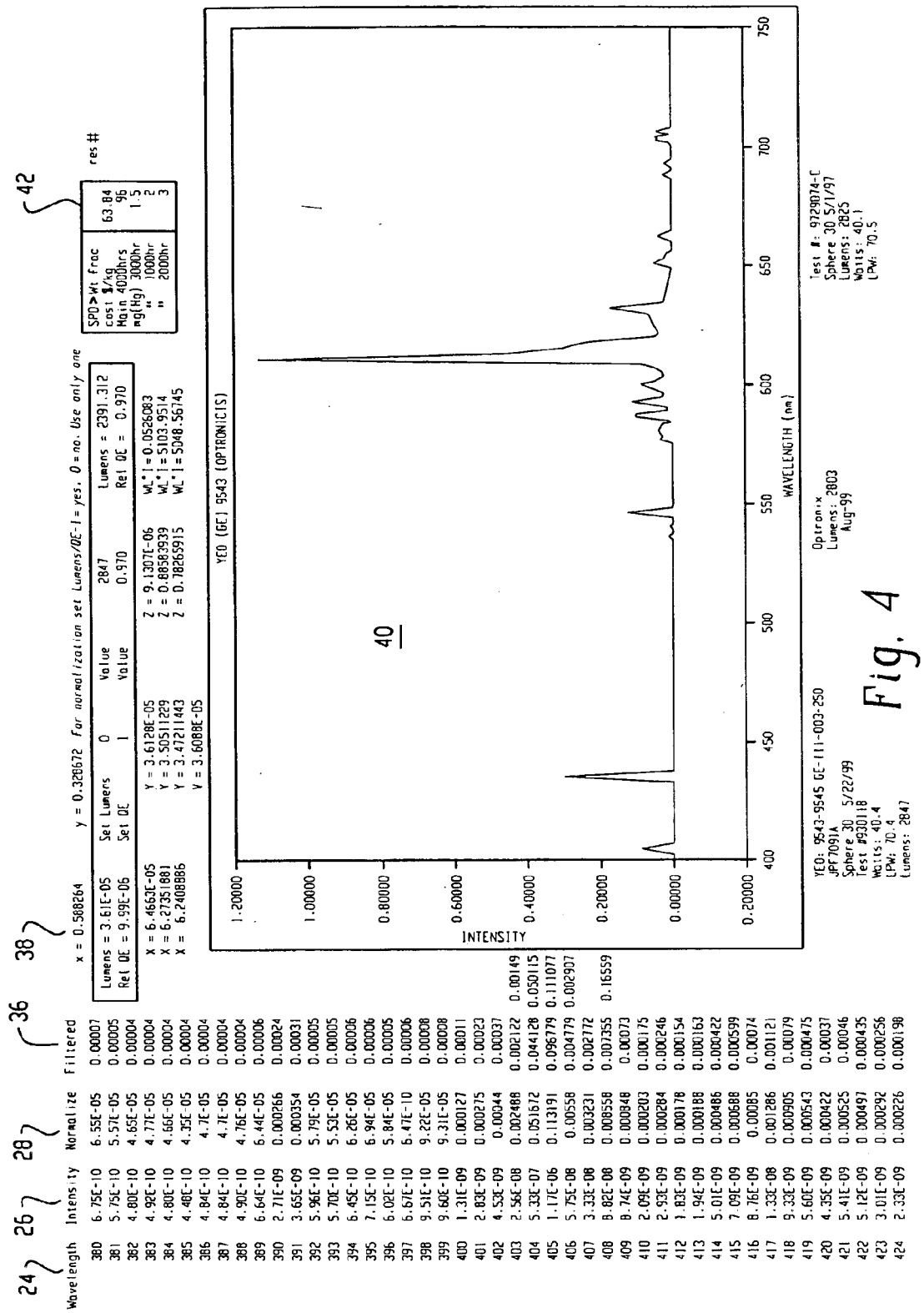
FIG. 4 is a screen illustrating the type of spectral information stored with respect to an individual phosphor.

FIG. 3 illustrates an input or spreadsheet screen identified having a number of rows or columns (specifically rows 1–41 and columns A–U are shown). This sheet contains information and links to other screens or spreadsheets for displaying, inputting, or calculating information relating to lamp characteristics or simulation of different phosphor blends (see, e.g., Lamp, Coat, Filter, Y1, Y2, etc . . . tabulated along a bottom row of the screen). Although the information is related to designing fluorescent lamps, it will be appreciated that the invention will find application in designing other lamp lines that use phosphors, such as electrodeless, high pressure mercury, LED lamps, etc. A first data storage or table 20 includes multiple rows of data or information (e.g., rows 1–41, or more) relating to different individual phosphors. For example, an individual phosphor may be identified by an acronym in column A and more detailed pedigree information in column B. A third column C is labeled "coefficient." It represents the fractional contribution of each phosphor spectrum to the total spectral power distribution of the blend of phosphors shown in a central graph 22. As will be described in greater detail below, each individual phosphor is catalogued in a first data storage (e.g., FIG. 4 represents one such sheet) which includes spectral data associated with the individual phosphor. This data is obtained, for example, from a linear fluorescent lamp having a preselected length, diameter, fill gas, pressure, and current that is coated with the individual phosphor. Tests conducted on the lamps provide measurements or data relating to wavelength, intensity, etc. of the tested lamp. That information is entered into the first data storage sheet where it is selectively accessed by the processor. By preparing test lamps having the same criteria, except for the use of a different individual phosphor, the first data storage serves as a lookup table for the different phosphors used in the software.

FIG. 4 is a representative sample of a lamp with an individual phosphor spectrum. In the current version of the program there are 86 such sheets, one for each of 86 different phosphors. The first column 24 provides wavelength values for 1 nm between 380 to 750 nm. Column 26 is an indication of the intensity in watts/nm/cm$^2$ as measured by a spectrometer during the individual phosphor testing noted above. The spectrum is normalized in column 28, multiplied by a constant so that it will either provide a measured number of lumens or a relative quantum efficiency. The lumens and relative quantum efficiency is computed by summing the product of the intensity by the wavelength and dividing this number by the number of the UV output quanta in cell 30 of FIG. 3.

To normalize a relative quantum efficiency, the cell adjacent set lumen in box 32 of FIG. 4 is equal to zero and the next adjacent set QE is equal to one. To normalize the measured lumens, type numeral "1" into the cell next to set lumens and "0" in the cell next to set quantum efficiency. If the spectra data are normalized to the relative quantum efficiency, then if UV intensities are changed in cell 34 of FIG. 3, all spectra will be re-normalized to correspond to the new UV output of the lamp, assuming quantum efficiencies are unchanged. Column 36 provides a value representing the normalized spectra multiplied by transmission of the filter from the filter spreadsheet. In addition, the values of four visible mercury lines are provided in column 38. In addition, a graphical representation 40 of the spectrum for each phosphor is provided. As noted, this is represented as wavelength versus intensity, i.e., the information from columns 24 and 26. Each individual phosphor sheet includes additional information., for example, cost, maintenance, and mercury consumption 42.

Referring again to FIG. 3, the values in column C representing the fractional contribution of each phosphor spectrum can be changed either manually or calculated by the program as will be described further below. The weight fraction exhibited in column D, on the other hand, is computed by multiplying the fraction of the spectral power distribution by a factor that accounts for different phosphor ultraviolet or UV absorption coefficients, densities, and particle sizes. These factors were arrived at using weight fractions known to give specific calculated spectra Cost, maintenance, and mercury consumption values are provided in columns E, F and G, respectively. These columns access numbers in referring to the properties of individual phosphors and contained on the individual phosphor sheets illustrated in FIG. 4. Cost depends upon the weight of the phosphor used in the blend and a variable cost/kilogram of the phosphor that is recorded and may be easily changed as appropriate in the individual phosphor data sheets. Maintenance is a value relating to phosphor depreciation expressed in light output as a function of time. Maintenance and mercury consumption values are likely to be proportional to the relative cross-sectional area of each phosphor. This can be computed from the weight divided by the density times the diameter of the particle or may be estimated using the fraction of the UV absorbed by that phosphor.

It will be appreciated that the first data storage 20 is merely representative of one type of desired format and that a greater or lesser number of columns for displaying data or information can be used as desired.

The coefficients in column C can be selectively changed or altered by the user. By simply inputting a desired fractional contribution of each phosphor (the total of the coefficients normalized to 1), the spreadsheet will automatically update the spectrum illustrated in the graphical display 22, as well as all of the properties of the final lamp.

Alternatively, and as will become more apparent below with respect to FIGS. 7–14, desired target or output parameters can be input by the user. An iteration is then conducted by the CPU for selected phosphors using an algorithm, such as steepest descent. The CPU will iterate the coefficient of the individual phosphor spectra until it finds a local solution, maximizing, minimizing, or setting a user specified parameter, such as lumens, cost, or color rendition subject to user specified constraints such as lamp color, if possible. The coefficients of the phosphor spectra which satisfy the desired lamp performance characteristics appear in the proper locations in column C. Moreover, the spectrum 22 will be updated, as will the properties of the desired spectrum and other dependent variables, such as the cost of the blend.

The screen display of FIG. 3 includes a second data storage or table 34 relating to physical lamp characteristics. The table 34, however, is a summary of more detailed information in the second data storage shown, for example, in FIG. 5. The summary in FIG. 3 under column I identifies the type of lamp, column J provides a lamp length, column K includes the lamp diameter (where the value T refers to ⅛ inch increments of the lamp outer diameter). In addition, column L provides information regarding the fill gas, column M the pressure of the fill gas (in torr), and lamp current is exhibited in column N in amps.

In order to calculate the UV power and the ratio of visible mercury lines tabulated in portion 30 of the table 34, reference is made to FIG. 5. Here, UV output power and the ratio of visible mercury lines are set forth in cells 62, 64, 66, 68 which represent different types of phosphor lamps. For example, characteristics of a reference lamp identified as an F40 lamp are provided. The first row contains UV rated power values (in watts) for four mercury lines at 185 nm (nanometers), 254 nm, 303 nm, and 360 nm. These are used to calculate a number proportional to the number of UV quanta. In the example shown in FIG. 5, and particularly cell 62, power values are only provided for the 185 nm and 254 nm radiation. The power values are scaled to ~84% of those of the reference F40 type lamp in the case of a 32W T8 lamp. Since the phosphor spectra have been normalized to the number of quanta, the intensities of all the phosphor spectra will change if the radiated power of any of the mercury UV lines is changed. Thus, although the spectra contained in the exemplary embodiment relates to a 40W rapid start lamp referred to by the applicant as a F40 lamp, operated on an ANSI 60 Hz sinusoidal input circuit and run at 430 mA RMS current, other reference lamps and spectra can be used without departing from the scope and intent of the present invention. Thus, the present spreadsheet has the built-in flexibility of simulating other lamp types —although limited to other mercury fluorescent lamp types in this instance. Still further cells than 62, 64, 66, 68 may be included in the second data storage to include additional lamp data if desired.

It will also be appreciated that the information in these individual cells takes into account that different visible line intensities relative to the UV lines will be associated with different lamp types, for example, linear, Circline™, compact fluorescent lamps, etc. Consequently, below the intensity of the noted UV lines are numbers that are used to calculate the contributions of the visible mercury lines relative to their contributions to the spectra for the particular reference lamp. In cell 62 of the exemplary embodiment, the visible mercury line at 185 nm has an assigned value of 2.3, the line at 254 nm assigned value 23, etc. However, differences in the relative contributions of the visible mercury lines can be included. The values of the visible mercury line contributions could be determined empirically by comparing mercury line intensities of different lamp spectra or by a fundamental calculation, or semi-empirically using relations developed in the spreadsheet, as shown in FIG. 5. Again, it will be appreciated that the information of FIG. 5 is primarily used to provide information to table 34 shown in FIG. 3.

With continued reference to FIG. 5, the UV output of lamps of different lengths is calculated in section 80 which is entitled "Lumens/power for Fluorescent Lamps of Different Lengths." Data with regard to a reference lamp are provided in row 82; namely, an overall lamp length in column 84, the length of the base in column 86 is described as a distance cathode-to-lamp end, and a calculated value in column 88 which is the cathode-to-cathode distance. An effective arc length in column 90 is a calculated value arrived at by subtracting from the overall length of the lamp (column 84) the base lengths (column 86), the length of the electrode, and the intercept of light output versus cathode-to-cathode distance, that is, the effective non-light producing region of the cathode and anode fall at the ends of the lamp. Total arc power in column 100 is divided by the total arc length and multiplied by an efficiency factor to provide a determined, calculated, or estimated UV power or UV quanta per unit of arc length in column 110. This UV quanta per unit of arc length is then multiplied by the arc length of a new lamp to achieve the values in row 84. Box 120, entitled "Linear F Lamp Design Tool" semi-empirically calculates UV power per unit arc length (column 158) as a function of the lamp current (column 136), the bulb inner diameter (column 152), the fill gas pressure, and fill gas composition. Again, from the overall lamp length in column 122, end losses and non-light producing watts and lengths are removed (columns 124, 126, 128) and columns 134, 136, 138, 150 removed from total lamp power in column 132 to arrive at an effective arc power (in watts) in column 154.

A large amount of empirical data, plus reference data from textbooks such as Waymouth's book, (John F. Waymouth, *Electrical Discharge Lamps*, The M.I.T. Press, Cambridge Mass., 1971) permit the development of algorithms to fit the data. A number of algorithms could be developed so that one skilled in the art will recognize that the more extensive the empirical data collected and analyzed, the more precise the derived empirical equations. In this invention, functional forms were found for the positive column watts/unit length as a function of arc current, inner wall diameter, fill gas composition and fill gas pressure by fitting a large amount of empirical data.

Referring again to FIG. 3, a third data storage 200 provides a summary of coating information. Column I entitled "Coating" includes three rows 204, 206, 208 for the top coat, base coat, and precoat, respectively. A three layer structure is commonly used as a multiple layer diffuse phosphor/reflector coating. Additional columns J, K, L relate to the weight, cost and fraction not covered for the coating. Row 216 provides a total material cost to the coating and row 218 provides information relating to a single coat.

It will be appreciated that this portion 200 of the display also provides a link to a separate spreadsheet referred to as COAT (which is referenced in the bottom row of tabs in FIG. 3) used to calculate the optical properties of the layered fluorescent lamp coating. The COAT spreadsheet is illustrated in greater detail in FIG. 6. Again, three rows 230, 232, 234 reference the top coat, base coat, and precoat, respectively. Additional columns of information are then provided. By way of example only, column 236 references the particle size, column 238 references the density in grams per $cm^3$, column 240 is a ratio of the total coated area to reference lamp area, column 242 identifies the number of layers, and column 244 is the computed fraction of the surface area not covered by a phosphor or precoat layer.

The fraction of surface area not covered in column 242 and the percent UV absorbed, reflected and transmitted, and the visible light absorbed 245 is computed from suitably developed equations. For example, those equations developed by Bodo and Hangos (A. Bodo and I. Hangos, Act. Phy. Hung., 3, 155 (1953) and Kubelka-Munk (B. Kubelka and F. Munk, Z. Tech. Physik, 12, 593 (1931) can be used as starting references. Again, the particular equation used to calculate these desired values may vary and others can be used without departing from the scope and intent of the present invention.

Referring again to FIG. 3, a number of target or output parameters are included in the right-hand portion of the display screen. For example, under the "Luminous Flux" 300 is given the radiated lights in watts, the lumens or light output calculated for the lamp, and the lumens per radiated watt or lumenosity. Also given is the scotopic or low light level lumens and a scotopic/photopic ratio 302, 304. The "Plant" column 306 weighs the spectral output by a plant growth response curve and may be used when designing a plant light, just as another column can be added for other particular types of designs. For example, a skin tanning value or resin curing value could be added if these types of lamps are to be designed. "Radiant Flux (W)" 310 is expressed as a total watts radiated by the lamp, while the "Tristimulus" values 320 are useful in obtaining the chromaticity, or color, of the lamp expressed in red, green, or blue coordinates, x, y and z. The "Color Rendition Indices" 330 are numbered as Sample rows 1–14, and are displayed in color to permit a comparison of the sample relative to how the colors would compare or be rendered under an incandescent source. The first eight values (rows 1–8), for example, are summed and averaged to obtain what is known as the "Color Rendering Index" which is highlighted at cell 332. In addition, a correlated color temperature (CCT) value is shown at cell 340. It corresponds to a color temperature in degrees Kelvin. An overall luminance or brightness value is likewise provided at cell 350.

Figure 7:
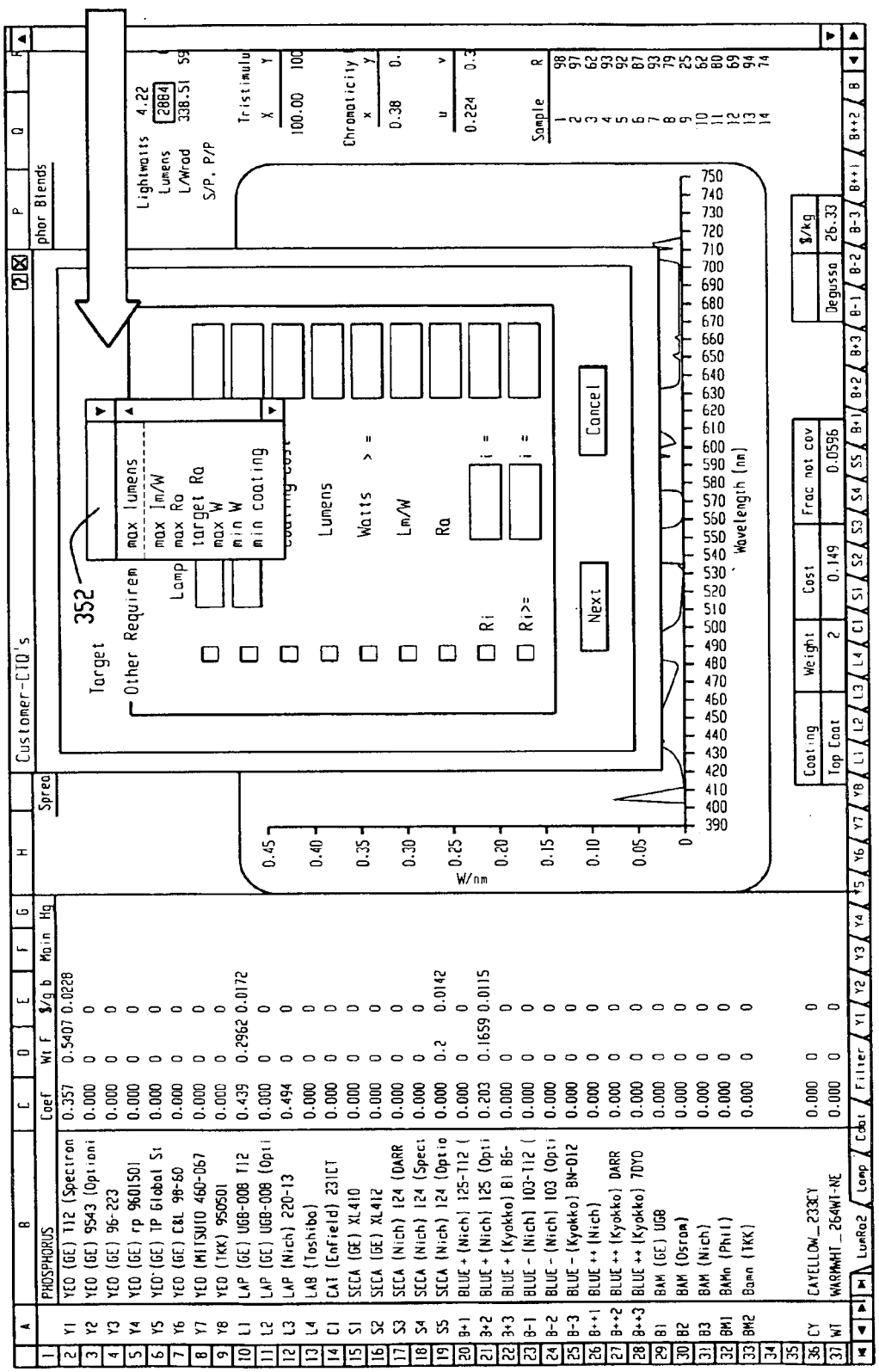

If a customer desires certain lamp parameters, one or more of these values 300–350 are input as either targets or constraints. Another manner of inputting this information is through a series of screens represented in FIGS. 7–14. FIG. 7 illustrates different lamp parameters that may be input or targeted by the user. Seven different parameters are identified in the pull down screen of cell 352, namely, "max lumens", "max lm/w", "max Ra", "target Ra", "max W", "min W", and "min coating cost."

Figure 8:
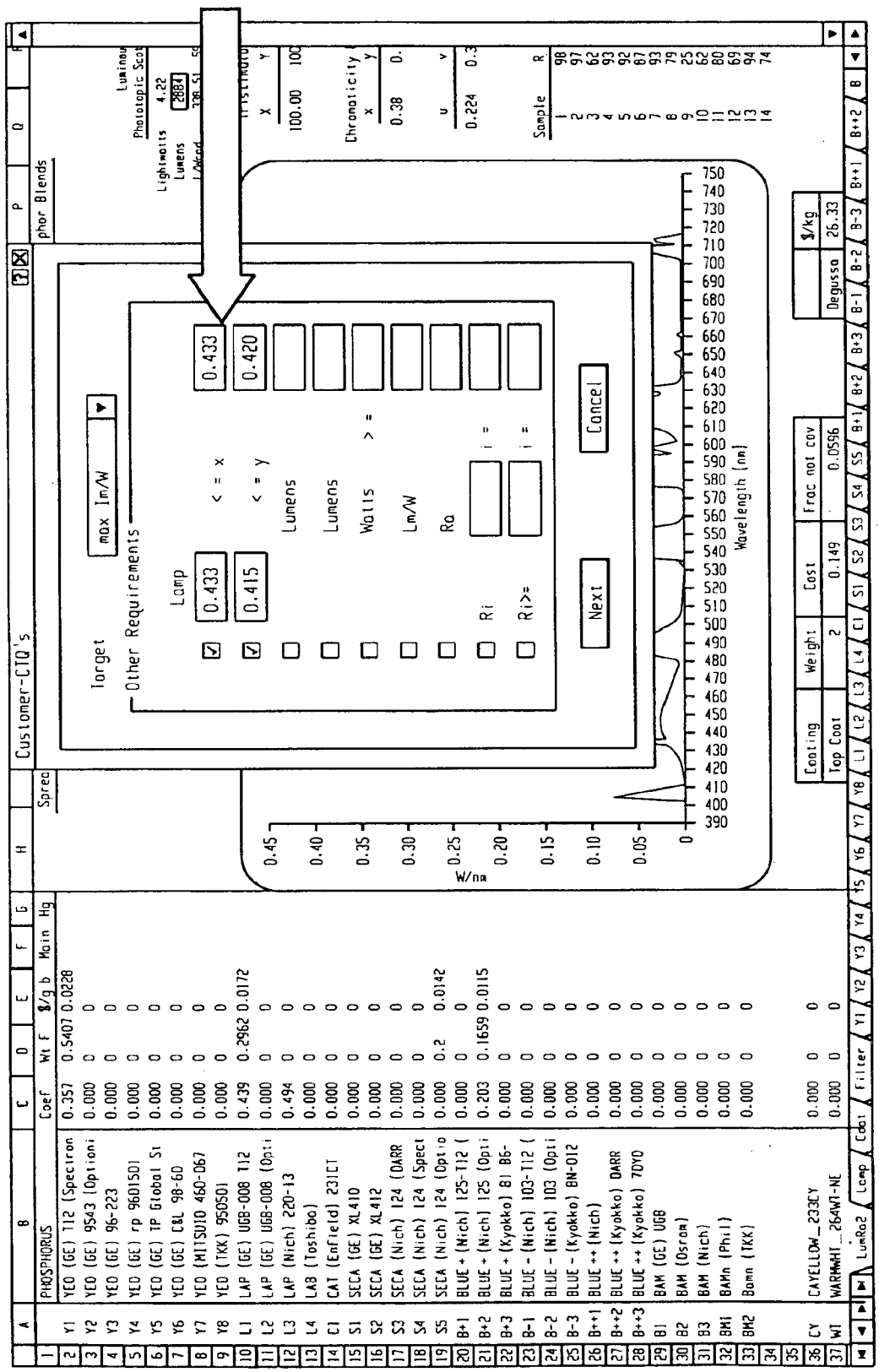
Figure 9:
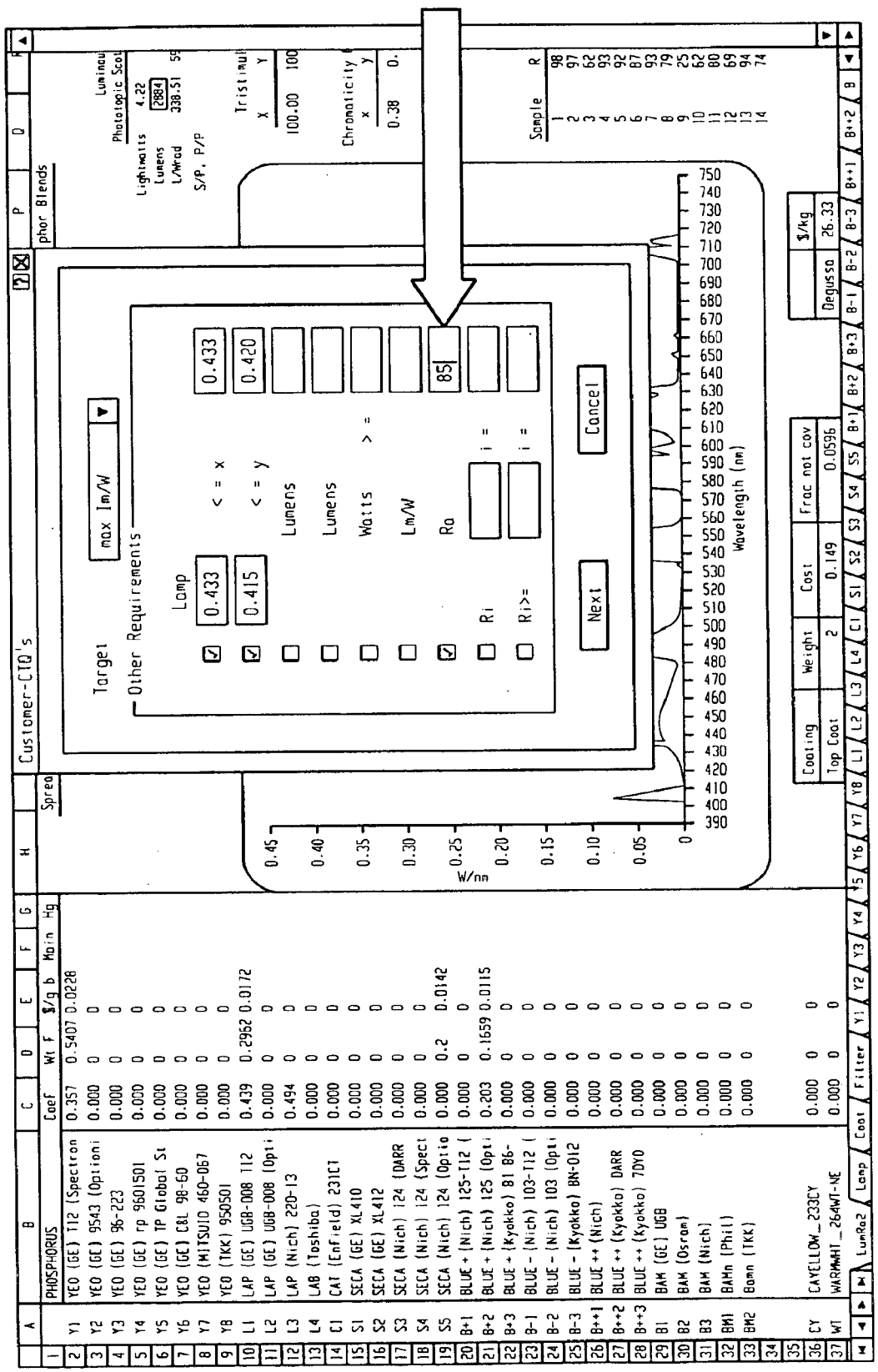

FIGS. 8 and 9 illustrate further input parameters that can be selected such as color parameters "x" and "y" of the lamp, or "coating cost", "lumens", "watts", "Lm/W", "Ra", and "Ri." By clicking the small open box next to a parameter the user chooses to restrict or constrain the value of that parameter. Of course, it will be appreciated that these are exemplary values only and that other parameters or values could be and will be used by the authors without departing from the scope and intent of the present invention.

Figure 10:
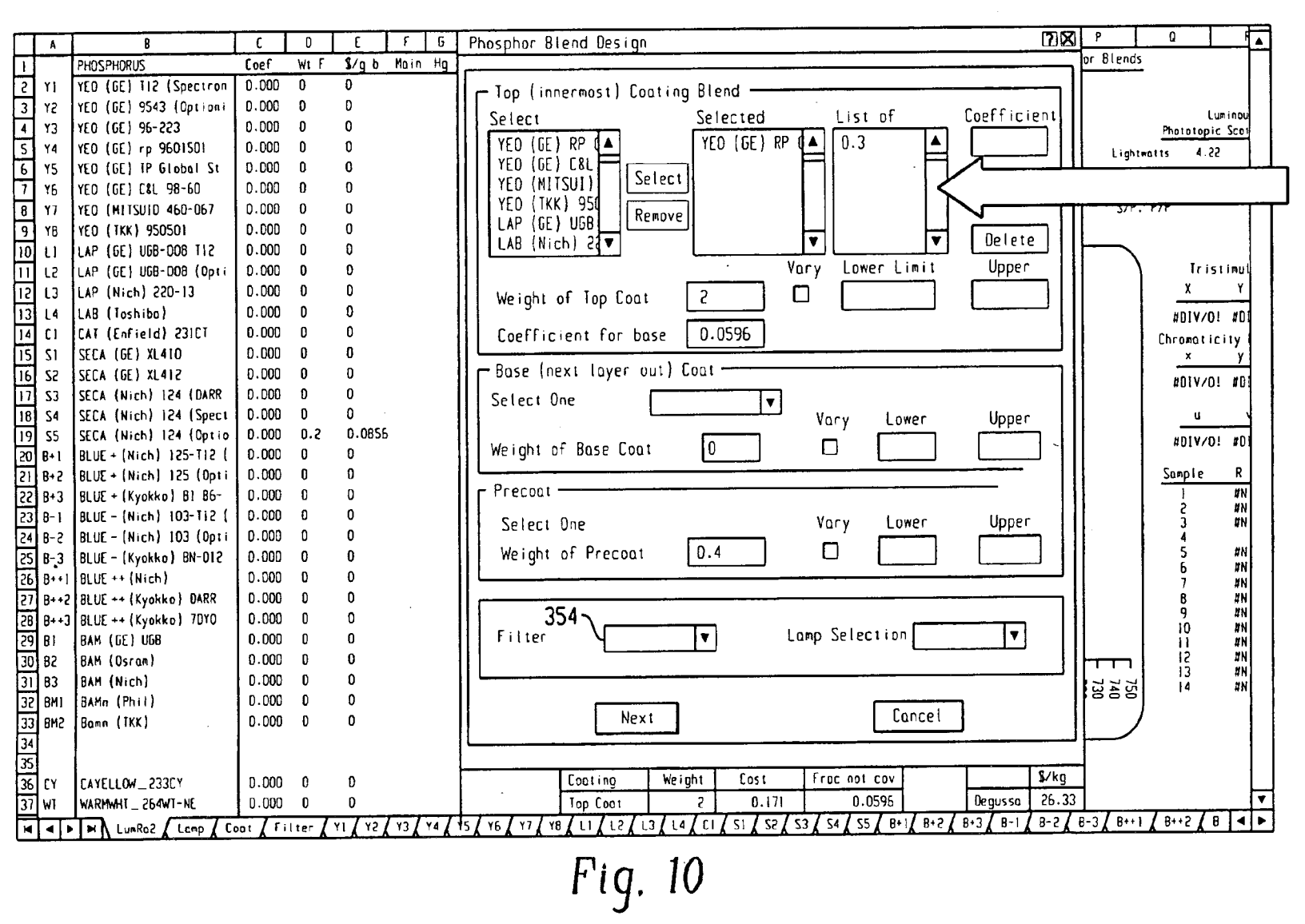
Figure 11:
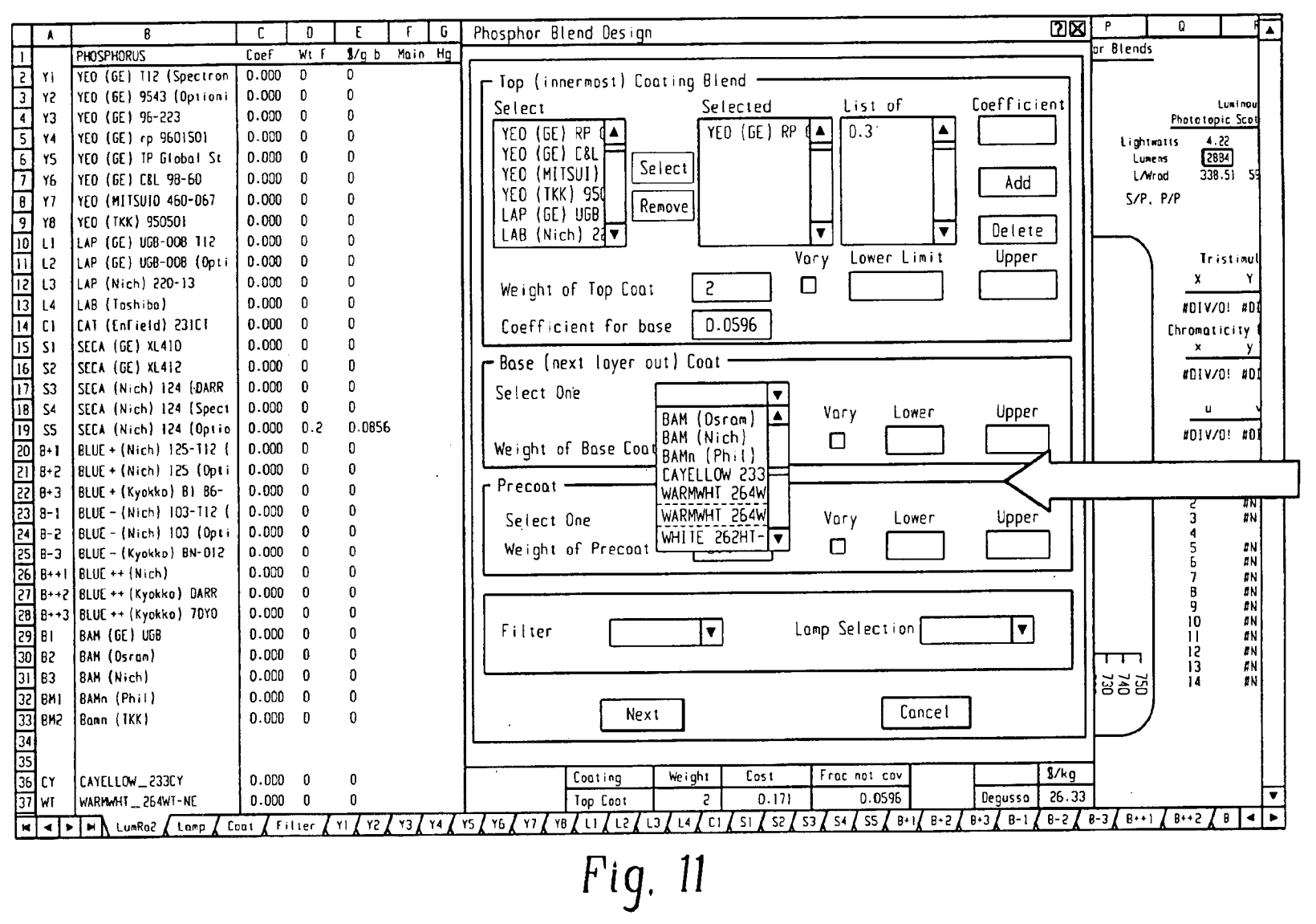
Figure 12:
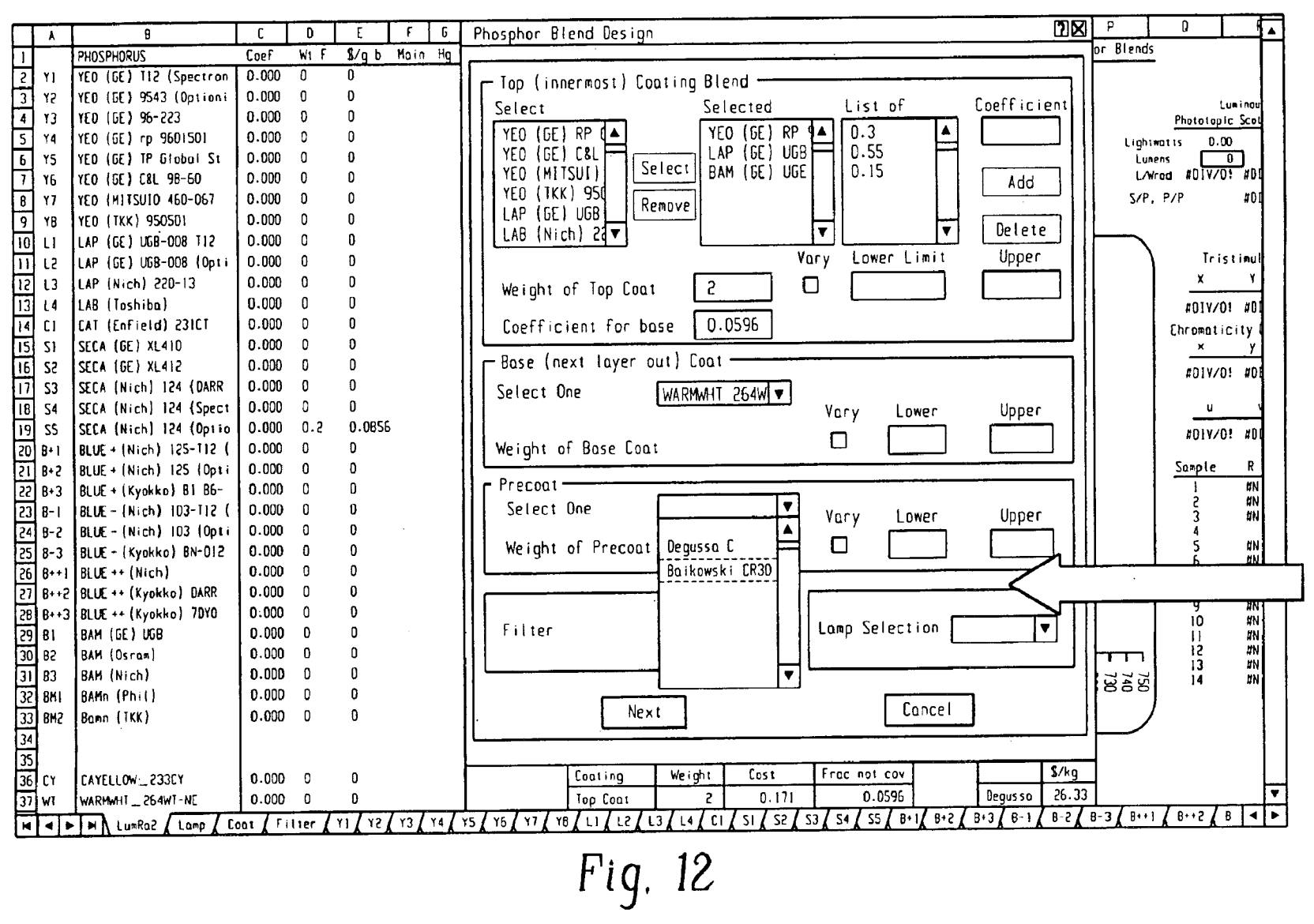

FIGS. 10–12 demonstrate how the coating system is designed. Since three coats are typically the maximum in a fluorescent lamp, there are three sections, each including cells that allow the user to select the type of phosphor or phosphors or reflectors. Likewise, upper and lower limits can be input on the respective coating weights rather than a precise value. In addition, a filter input cell 354 is provided as yet another parameter that can be controlled or selected.

Figure 13:
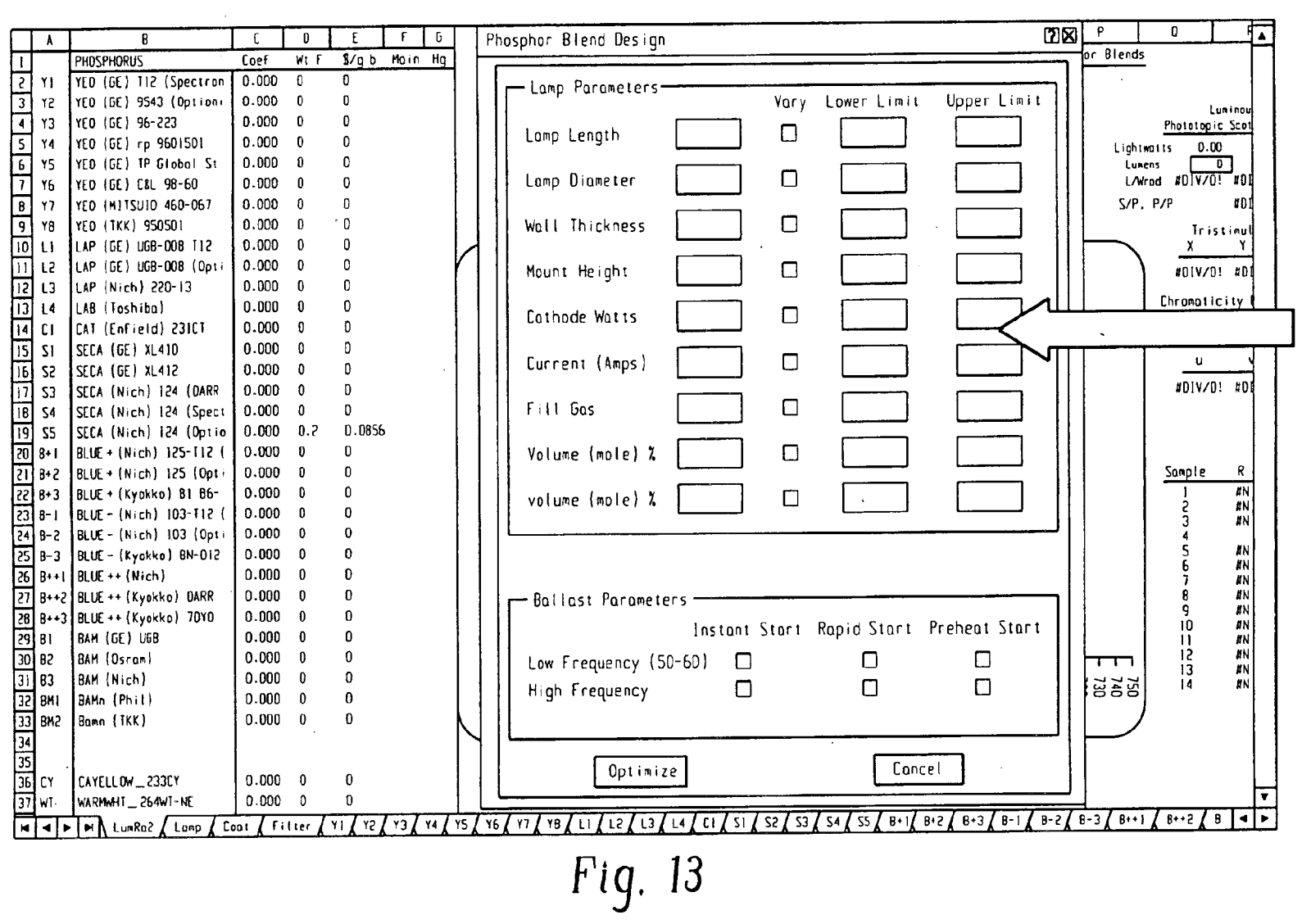

The user can pick a standard lamp design or custom and then click next in which case a screen, such as illustrated in FIG. 13 appears. It is evident that in this screen the user selections can relate to lamp design parameters such as "lamp length", "diameter", "wall thickness", "mount height", "cathode watts", "current", "fill gas", or "composition." Again, these parameters may be selected or input as a precise value or upper and/or lower limits may be input. Moreover, ballast type may be selected. For example, the customer may desire an "instant start", "rapid start", or a "preheat start" type of ballast and that information can be selected before the iterations are undertaken.

Figure 14:
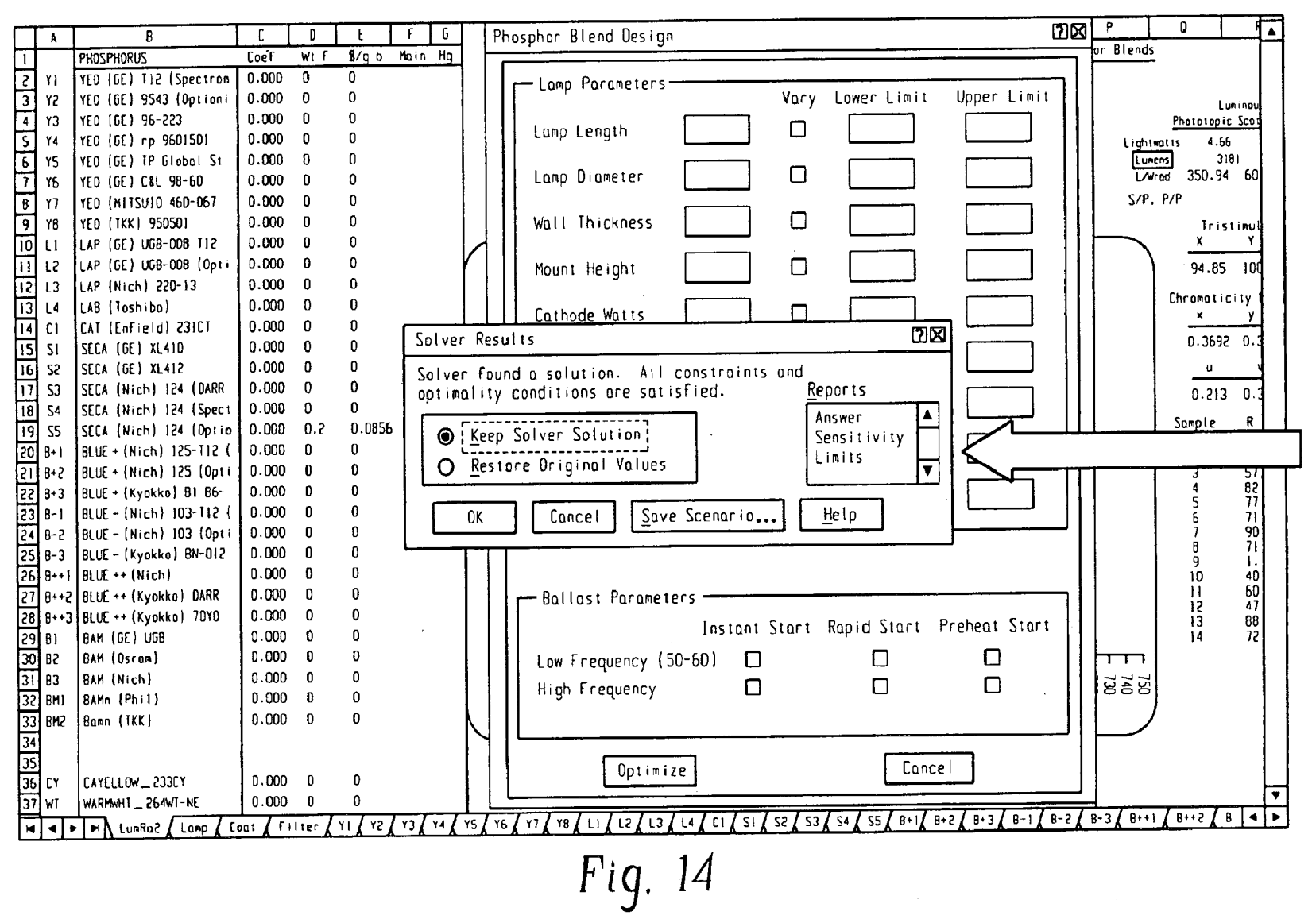

Once the information on the lamp design has been input or selected, or selected to be varied, the user clicks on the button labeled optimize and the CPU then calculates or iterates values that meet the constraints or optimize the target customer characteristics. For example, the coefficients of different individual phosphors are varied along with physical lamp parameters. When a solution is found, a pop-up screen, such as shown in FIG. 14, prompts the user to accept, save, alter, etc. the calculated solution. The phosphor coating and lamp parameters satisfying the target and constraints then appear in the main design sheet, FIG. 3. The user can then print out the input sheets along with the solution in the form of FIG. 3

In summary, FIG. 3 is used to calculate the spectra and light output characteristics of the lamp being designed. It can also be used to input information, such as coefficients in column C. The spectrum and light output characteristics in columns Q through U will then be updated. A separate screen, comparable to FIG. 4, is available for each phosphor stored in the system. Here, eighty six (86) different phosphors are represented, each on its own sheet. The spectral data for each individual phosphor and additional data such as cost, lumen maintenance, mercury composition, etc., are stored on each sheet and then combined in the sheet shown in FIG. 3. Similarly, a filter sheet (not shown) can be used to modify the light output of all phosphors. Data relating to the different lamp types is displayed in FIG. 5. For example, the invention includes parameters relating to several hundred standard lamp designs or the lamp may be customized by changing lamp parameters. The UV and visible radiation output will then be calculated as descrived above and this information fed back to the screen of FIG. 3 and used to normalize the output of all individual phosphor files. Coating characteristics are calculated in FIG. 6 to modify the light output depending on the coating weight of each of up to three layers of coating. In FIG. 7, a user selects a target, such as maximum lumens, efficiency, color rendition, etc. In FIGS. 8 and 9, constraints such as lamp color, or color range, or range of wattage, color rendition, etc. are selected by the user. In FIGS. 10–12, potential sets of phosphors for a top layer of coating (FIG. 10) are selected, if desired, a phosphor layer of underneath (FIG. 11) and/or a reflector for the layer next to the inside of the glass tubing (FIG. 12) and a range of coating weights for each layer. In FIG. 13, if the user does not wish to choose a set of lamp parameters from the library corresponding to a standard lamp, nominal sets of lamp parameters can be selected, such a current, inside diameter, lamp length, etc., and allow these to vary within some ranges. After setting up all the parameters to be varied, the user clicks the button on the bottom of the screen to optimize. As shown in FIG. 14, the program lets the user know when it has found a lamp design meeting target values by varying the parameters specified in FIGS. 7–13. Once a solution has been obtained, the design parameters appear in the main screen (FIG. 3) and the input screens and the final design can be printed.

The invention has been described with reference to an exemplary embodiment. Obviously, modifications and alterations will occur to others upon a reading and understanding of this specification. For example, additional sheets could be added to incorporate information relating to lamp life as it relates to characteristics of the lamp construction (in particular, characteristics relating to cathode construction), ballast design linking a ballast component to lamp current and other operating characteristics of the lamp, or lamp starting volts as related to lamp construction (for example, gas composition). It is intended to include all such modifications and alterations in so far as they come within the scope of the appended claims or the equivalents thereof.

What is claimed is:

1. A system for generating parameters for use in manufacturing lamps employing phosphors, the system comprising:
    a first data storage having spectral data stored therein for individual phosphors;
    a second data storage having lamp characteristics stored therein; and
    a processor that generates lamp parameters, including at least one of blends of individual phosphors, lamp operating characteristics, and physical lamp characteristics.

2. The system of claim 1 wherein the first data storage includes pricing data for the individual phosphors.

3. The system of claim 1 wherein the first data storage includes performance characteristics of the individual phosphors.

4. The system of claim 3 wherein the performance characteristics includes maintenance data regarding light output as a function of time.

5. The system of claim 1 wherein the first data storage includes a coefficient index representing the weight percentage of the selected individual phosphors in the blend.

6. The system of claim 1 wherein the second data storage includes at least one of lamp length, lamp diameter, type of fill gas, fill pressure, and current.

7. The system of claim 1 further comprising a third data storage having parameters relating to coating layers.

8. The system of claim 7 wherein the third data storage includes information relating to a precoat layer, a base coat, and a top coat.

9. The system of claim 7 wherein the third data storage includes information relating to pricing of the coating.

10. The system of claim 7 wherein the third data storage includes information relating to the weight fraction of each phosphor needed for the blend.

11. The system of claim 1 further comprising a fourth data storage storing information relating to a filter layer.

12. The system of claim 1 further comprising target/output parameters including one of at least luminous flux, radiant flux, and chromaticity values.

13. The system of claim 12 wherein the target/output parameters are values calculated in response to iterations conducted by the processor.

14. The system of claim 12 wherein the target/output parameters are values selected by a user as a target.

15. The system of claim 12 wherein the target/output parameters are input to the processor in calculating at least one of a phosphor blend, physical lamp characteristics, coating layers, and a filter layer.

16. A method of generating parameters for designing a lamp employing phosphors comprising the steps of:
    selecting desired phosphors from a first data storage;
    selecting one of desired lamp operating characteristics and physical characteristics from a second data storage; and
    calculating lamp parameters based on the selecting steps and using spreadsheets.

17. The method of claim 16 wherein the phosphor selecting step includes inputting proportions of desired phosphors before calculating the lamp parameters.

18. The method of claim 16 comprising the further step of inputting desired lamp operating characteristics before calculating the lamp parameters.

19. The method of claim 16 comprising the further step of generating a graphical representation of the phosphor blend spectral power distribution which is automatically updated as different phosphor systems are selected.

20. The method of claim 16 wherein the calculating step includes at least one of coating weights and cost, type of lamp including the length, diameter, fill gas and pressure thereof, current, tristimulus values, color temperature, color rendering indices, light output, and percentage of individual phosphors in a blend including cost.

21. The method of claim 16 wherein the first data storage includes spectral data for individual phosphors including wavelength and intensity data for each wavelength and comprising the further step of normalizing the intensity data for each wavelength.

22. The method of claim 16 wherein the calculating step includes calculating the weight of phosphor in any of up to three coatings.

23. The method of claim 16 wherein the calculating step includes calculating an effective arc length for the lamp, an effective arc power, and an arc power per unit arc length.

24. A software package or system for designing fluorescent lamps comprising:
    (a) a data sheet for each phosphor containing spectral and other information regarding each phosphor;
    (b) a processor for combining into a phosphor blend the spectra of selected individual phosphors by multiplying each spectra by a coefficient and adding and then evaluating the light properties of a lamp coated with the phosphor blend;
    (c) a second data storage relating lamp output to lamp parameters;
    (d) a third data storage, other calculations relating light output to coating weights and coating construction; and
    (e) a coupler that interconnects these sheets together so that a change in any phosphor amount, coating weight, or lamp parameter properly effects the calculated performance of the lamp to be designed.

* * * * *